(12) United States Patent
Lee et al.

(10) Patent No.: US 8,513,634 B2
(45) Date of Patent: Aug. 20, 2013

(54) NONVOLATILE DATA STORAGE, SEMICODUCTOR MEMORY DEVICE INCLUDING NONVOLATILE DATA STORAGE AND METHOD OF FORMING THE SAME

(75) Inventors: Jung-hyun Lee, Yongin-si (KR); Sung-ho Park, Seoul (KR); Myoung-jae Lee, Suwon-si (KR); Young-soo Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 109 days.

(21) Appl. No.: 12/457,539

(22) Filed: Jun. 15, 2009

(65) Prior Publication Data

US 2009/0256128 A1 Oct. 15, 2009

Related U.S. Application Data

(63) Continuation-in-part of application No. 11/013,923, filed on Dec. 17, 2004, now abandoned.

(30) Foreign Application Priority Data

Dec. 17, 2003 (KR) .................................. 2003-92614

(51) Int. Cl.
*H01L 29/02* (2006.01)
(52) U.S. Cl.
USPC .......... 257/2; 257/14; 257/239; 257/E47.001; 438/3; 438/240; 438/396; 438/593

(58) Field of Classification Search
USPC ................ 257/2, E47.001, 14, 239, 288, 315, 257/329; 438/593, 3, 240–253, 396–398; 365/148
See application file for complete search history.

(56) References Cited

U.S. PATENT DOCUMENTS

| 3,336,514 A | 8/1967 | Hiatt et al. |
| 3,796,926 A | 3/1974 | Cole et al. |

(Continued)

FOREIGN PATENT DOCUMENTS

| JP | 1996-0249724 A | 9/1996 |
| JP | 63-226981 | 9/1998 |

(Continued)

OTHER PUBLICATIONS

Hickmott, T.W., "Electrode Effects and Bistable Switching of Amorphous $Nb_2O_5$ Diodes," Solid State Electronics, Elsevier Science, vol. 13, No. 7, pp. 1033-1047 (Jul. 1970).

(Continued)

*Primary Examiner* — Evan Pert
*Assistant Examiner* — Mark A Laurenzi
(74) *Attorney, Agent, or Firm* — Harness, Dickey & Pierce, P.L.C.

(57) ABSTRACT

A data storage and a semiconductor memory device including the same are provided, the data storage including a lower electrode, a first discharge prevention layer stacked on the lower electrode, a phase-transition layer on the first discharge prevention layer, a second discharge prevention layer stacked on the phase-transition layer, and an upper electrode stacked on the second discharge prevention layer. The phase transition layer includes oxygen and exhibits two different resistance characteristics depending on whether an insulating property thereof changed. The first and second discharge prevention layers block discharge of the oxygen from the phase transition layer.

14 Claims, 3 Drawing Sheets

(56) References Cited

U.S. PATENT DOCUMENTS

| | | | |
|---|---|---|---|
| 4,118,727 | A | 10/1978 | Laplante |
| 4,636,833 | A | 1/1987 | Nishioka et al. |
| 4,891,684 | A | 1/1990 | Nishioka et al. |
| 4,937,650 | A | 6/1990 | Shinriki et al. |
| 5,681,632 | A | 10/1997 | Kitaura et al. |
| 6,072,689 | A | 6/2000 | Kirlin |
| 6,518,673 | B2 | 2/2003 | Herr et al. |
| 6,781,175 | B2 | 8/2004 | Yang et al. |
| 6,815,744 | B1 | 11/2004 | Beck et al. |
| 6,885,646 | B2 | 4/2005 | Zhang |
| 2001/0024387 | A1 | 9/2001 | Raaijmakers et al. |
| 2003/0045082 | A1* | 3/2003 | Eldridge et al. ............... 438/593 |
| 2003/0087094 | A1* | 5/2003 | Smith et al. ................... 428/402 |
| 2004/0217410 | A1 | 11/2004 | Meng et al. |
| 2004/0264107 | A1 | 12/2004 | Hunt et al. |
| 2005/0037546 | A1 | 2/2005 | Yeh et al. |
| 2006/0028787 | A1 | 2/2006 | Yoshida et al. |

FOREIGN PATENT DOCUMENTS

| | | |
|---|---|---|
| JP | 3336514 | 10/2002 |
| JP | 2002-537627 | 11/2002 |
| JP | 3454821 | 10/2003 |
| KR | 10-0228051 B1 | 11/1999 |
| KR | 10-2000-0052840 A | 8/2000 |
| WO | WO 93/04506 | 3/1993 |
| WO | WO 00/49659 | 8/2000 |
| WO | WO 00/49659 A1 | 8/2000 |

OTHER PUBLICATIONS

Hickmott, T.W., "Electroluminescene, Bistable Switching, and Dielectric Breakdown of $Nb_2O_5$ Diodes," Journal of Vacuum Science and Technology, vol. 6, No. 5, pp. 828-833, (Sep. 1969).

European Office Action dated Jul. 22, 2010 in corresponding European Application No. 04257827.8.

JP Office Action issued Jul. 12, 2011 for corresponding JP Patent Application No. 2004-365229.

European Examination Report dated May 29, 2012 for corresponding European Application No. 04257827.8.

* cited by examiner

NONVOLATILE DATA STORAGE, SEMICODUCTOR MEMORY DEVICE INCLUDING NONVOLATILE DATA STORAGE AND METHOD OF FORMING THE SAME

CROSS-REFERENCE TO RELATED APPLICATION

This U.S. non-provisional patent application is a continuation-in part of, and claims the benefit of priority from, U.S. application Ser. No. 11/013,923, filed Dec. 17, 2004,now abandoned which claims the benefit of priority under 35 U.S.C. §119 from Korean Patent Application No. 2003-92614, filed on Dec. 17, 2003 in the Korean Intellectual Property Office, the entire contents of the above applications are herein incorporated by reference in their entirety.

BACKGROUND

1. Field

Example embodiments relate to a nonvolatile data storage of a semiconductor device, a semiconductor memory device including a nonvolatile data storage and methods of forming the same.

2. Description of the Related Art

A semiconductor memory device basically includes a transistor and a data storage. In recent years, various storage media (e.g., a magnetic tunneling junction (MTJ) cell included in a magnetic memory device), have been developed as substitutes for data storages.

Preferably, a semiconductor memory device has high integration, high operation speed, and superior nonvolatility sufficient to avoid loss of data stored therein even after power is switched off. On one hand, among widely used semiconductor memory devices, a dynamic random access memory (DRAM) has advantages of a high integration and a high operation speed, but does not have nonvolatility. Accordingly, a DRAM loses all data after power is interrupted. On the other hand, a flash memory is nonvolatile, but has a lower integration and a lower operation speed than the DRAM.

SUMMARY

Example embodiments relate to a nonvolatile data storage of a semiconductor device, a semiconductor memory device including a nonvolatile data storage and methods of forming the same.

Example embodiments provide a nonvolatile data storage and a nonvolatile semiconductor memory device including the data storage, which has a substantially high operation speed of a dynamic random access memory (DRAM) and a nonvolatililty of a flash memory device.

Example embodiments may be realized by providing a data storage of a semiconductor device, the data storage including a lower electrode, a first discharge prevention layer stacked on the lower electrode, a phase-transition layer on the first discharge prevention layer, a second discharge prevention layer stacked on the phase-transition layer, and an upper electrode stacked on the discharge prevention layer. The phase-transition layer includes oxygen and exhibits two different resistance characteristics depending on whether an insulating property thereof has been changed. The first and second discharge prevention layers may be metal oxide layers including a tantalum oxide layer or an aluminum oxide layer adapted to block discharge of the oxygen from the phase transition layer.

Example embodiments may be realized by providing a semiconductor memory device including a transistor and a data storage. The data storage may include a lower electrode, a first discharge prevention layer stacked on the lower electrode, a phase-transition layer on the first discharge prevention layer, a second discharge prevention layer stacked on the phase-transition layer and an upper electrode stacked on the discharge prevention layer. The phase transition layer includes oxygen and exhibits two different resistance characteristics depending on whether an insulating property thereof has been changed. The first and second discharge preventing layers may be metal oxide layers including a tantalum oxide layer or an aluminum oxide layer adapted to block discharge of the oxygen from the phase transition layer.

The first and the second discharge prevention layers may have a dielectric constant smaller than a dielectric constant of the phase-transition layer The phase-transition layer may be a dielectric layer capable of exhibiting two different resistance characteristics according to an applied voltage after at least the oxygen of the phase-transition layer is separated by electrons injected into the phase-transition layer. The phase-transition layer may be a niobium oxide layer.

The phase-transition layer may be a dielectric layer capable of exhibiting two different resistance characteristics according to an applied voltage after at least the oxygen of the phase-transition layer is separated by light applied to the data storage.

A thickness ratio of the first discharge prevention layer, the phase-transition layer, and the second discharge preventing layer may be 5:6:5.

The data storage may be a cylinder-type stacked data storage.

A semiconductor memory device according to example embodiments exhibits characteristics of both DRAM and flash memory in that the semiconductor device according to example embodiments is as fast as a DRAM and is as nonvolatile as a flash memory.

BRIEF DESCRIPTION OF THE DRAWINGS

The above and other example embodiments will become more apparent to those of ordinary skill in the art by describing in detail embodiments thereof with reference to the attached drawings in which.

DETAILED DESCRIPTION

Figure 1:
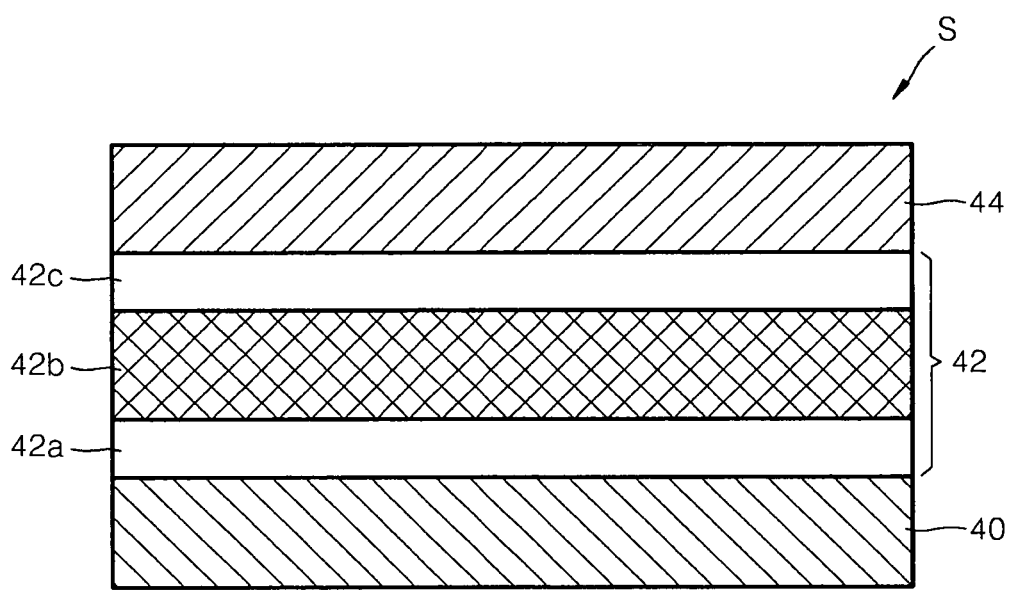
FIG. 1 illustrates a cross-sectional view of a nonvolatile data storage of a semiconductor device according to example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to a nonvolatile data storage of a semiconductor device, a semiconductor memory device including a nonvolatile data storage and methods of forming the same.

FIG. 1 illustrates a cross-sectional view of a nonvolatile data storage of a semiconductor device according to example embodiments.

Referring to FIG. 1, a nonvolatile data storage S of a semiconductor device according to example embodiments includes a lower electrode 40, a dielectric layer 42, and an upper electrode 44. The lower electrode 40 may be a platinum electrode. The upper electrode 44 may be a ruthenium electrode. Thus, the lower electrode 40 and the upper electrode 44 may be made of different materials. Generally, the type of dielectric layer 42 used determines the materials of the lower and upper electrodes 40 and 44.

The dielectric layer 42 includes a first insulating layer 42a, a phase-transition layer 42b stacked on the first insulating layer 42a, and a second insulating layer 42c stacked on the phase-transition layer 42b. Although not illustrated, another material layer may be interposed between the lower electrode 40 and the first insulating layer 42a. Similarly, another material layer may be interposed between the second insulating layer 42c and the upper electrode 44. The first insulating layer 42a is a dielectric layer having a set thickness and dielectric constant. For example, the first insulating layer 42a may be a silicon oxide layer, a tantalum oxide layer, or an aluminum oxide layer. The second insulating layer 42c is preferably identical to the first insulating layer 42a, but may be a dielectric layer different from the first insulating layer 42a.

The transition layer 42b may be a metal oxide layer including oxygen. If a voltage is applied to the data storage S, the oxygen may be separated from the phase transition layer 42b. The first insulating layer 42a and the second insulating layer 42c may be discharge prevention layers that block discharge of the oxygen from the phase transition layer.

In the data storage S shown in FIG. 1, a first voltage may be applied to the first insulating layer 42a and a second voltage may be applied to the second insulating layer 42c. A third voltage may be applied to the phase-transition layer 42b. Preferably, the third voltage, which may be applied to the phase-transition layer 42b is equal to or greater than the first voltage and the second voltage.

If thicknesses and facing areas of the first and second insulating layers 42a and 42c, and the phase-transition layer 42b are equal, the phase-transition layer 42b is preferably a dielectric layer having a dielectric constant larger than a dielectric constant of the first and second insulating layers 42a and 42c. For example, the phase-transition layer 42b may be a niobium oxide layer ($Nb_2O_5$) having a set (or desired) thickness.

Figure 5:
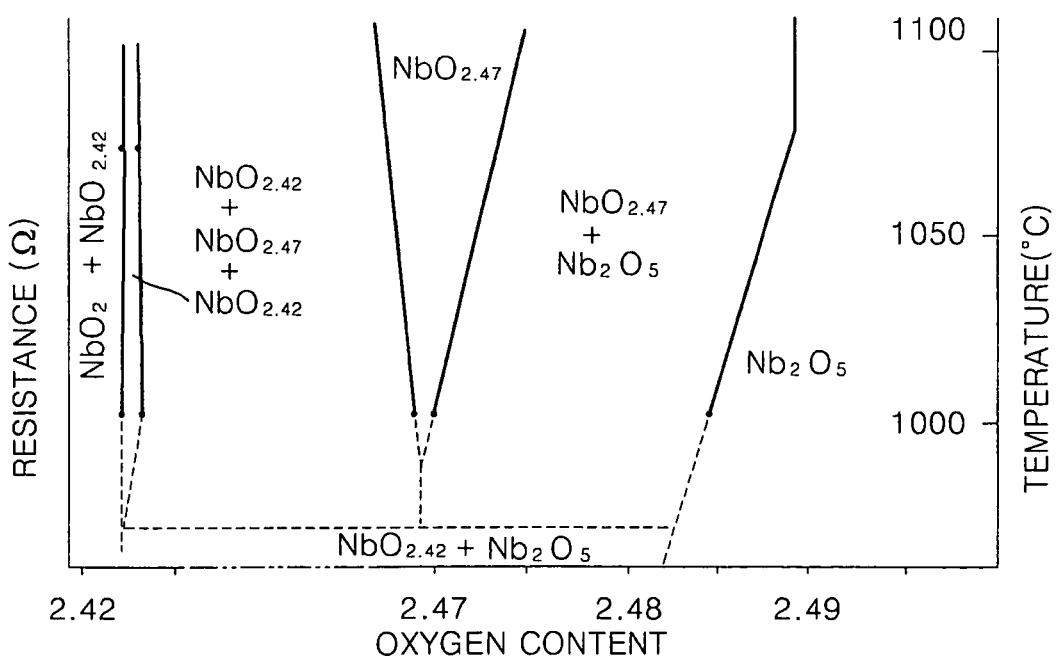
FIG. 5 is a plot illustrating various phases of a niobium oxide layer according to a content of oxygen.

FIG. 5 is a plot illustrating various phases of a niobium oxide layer according to a content of oxygen. If the phase-transition layer 42b is a niobium oxide layer showing various phases according to the content of oxygen, electrons are injected to the phase-transition layer 42b such that at least oxygen atom of the niobium oxide layer is separated and the insulating property of the phase-transition layer 42b is changed. The first and second insulating layers 42a and 42c prevent the separated oxygen atom from being discharged out of the phase-transition layer 42b.

Figure 2:
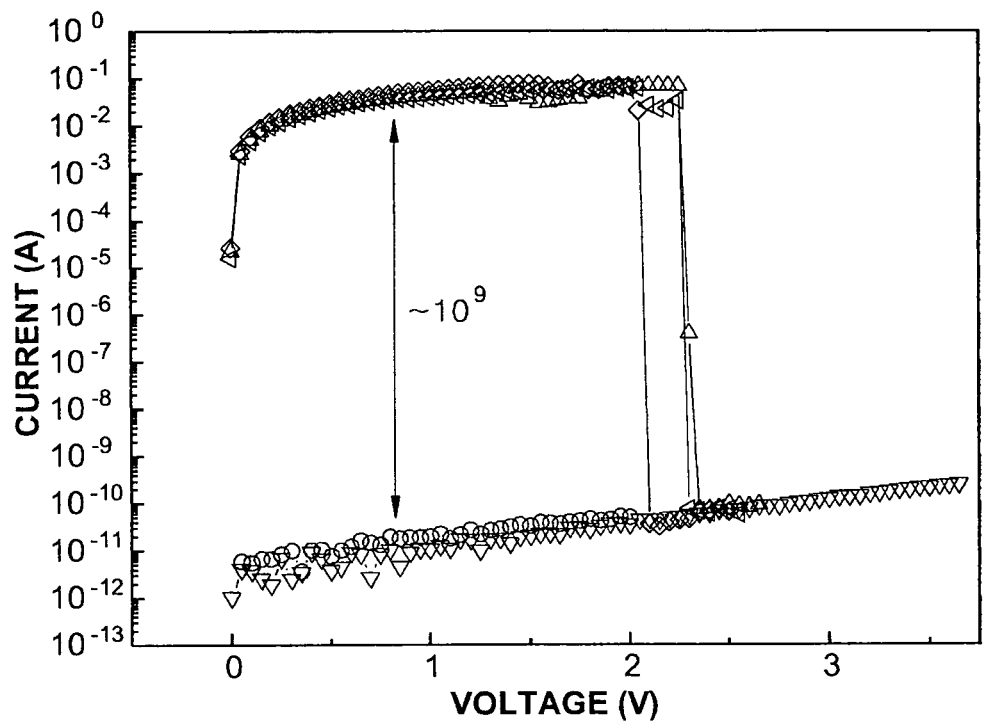
FIG. 2 is a graph of current versus voltage illustrating operational characteristics of the data storage of FIG. 1.

FIG. 2 is a graph of current versus voltage illustrating operational characteristics of the data storage of FIG. 1.

More specifically, FIG. 2 is a graph illustrating resistance characteristics of a data storage (referred to as a "to-be-tested data storage") including a platinum electrode as the lower electrode 40, a ruthenium electrode as the upper electrode 44, a tantalum oxide layer having a thickness of 50 Å as the first insulating layer 42a, a niobium oxide layer having a thickness of 60 Å as the phase-transition layer 42b, and a tantalum oxide layer having a thickness of 50 Å as the second insulating layer 42c.

Symbols Δ and ◇ in the graph of FIG. 2 represent a current change of the to-be-tested data storage if a voltage is applied to the to-be-tested data storage after the insulating property of the phase-transition layer 42b has been destroyed. That is, symbols Δ and ◇ represent a resistance change of the to-be-tested data storage.

Referring to symbols Δ and ◇ in the graph of FIG. 2, a current of the to-be-tested data storage measured if the voltage is applied to the to-be-tested data storage with the phase-transition layer 42b, the insulating property thereof having been destroyed, is approximately $10^{-2}$ A. However, as the voltage applied to the to-be-tested data storage exceeds a set (or threshold) value, for example, 2 V, the current of the to-be-tested data storage significantly decreases to approximately $10^{-11}$ A. This means that the resistance of the to-be-tested data storage significantly increases. Further, although a high voltage is applied to the data storage after the current of the to-be-tested data storage decreases to approximately $10^{-11}$ A, the current of the to-be-tested data storage does not significantly increase.

Hereinafter, the to-be-tested data storage with the phase-transition layer 42b, the insulating property thereof having been destroyed, is referred to as a first state data storage. A first voltage is a voltage measured if a relatively high current, e.g., $10^{-2}$ A, is measured in the first state data storage. A second voltage is a voltage measured if a relatively low current, e.g., $10^{-11}$ A, is measured in the first state data storage.

Symbols ∇ and ○ in the graph of FIG. 2 represent a current change of the first state data storage if the current of the first state data storage is significantly lowered by applying the second voltage to the first state data storage and then applying the first voltage to the first state data storage.

Referring to symbols ∇ and ○ in the graph of FIG. 2, although the first voltage is applied to the first state data storage after the current of the first state data storage is significantly lowered by applying the second voltage to the first state data storage, the current of the first state data storage does not increase. This means that after the resistance of the first state data storage is increased by applying the second voltage to the first state data storage, although any voltage is applied to the first state data storage, the high resistance of the first state data storage is maintained.

Data can be stored in a nonvolatile state in the data storage S having such current characteristics, i.e., resistance characteristics. For example, if the current of the first state data storage is high, i.e., the resistance of the first state data storage is low, it may be considered that an arbitrary data, e.g., a bit data 1, is written. Alternatively, if the resistance of the first state data storage is high, it may be considered that another arbitrary data, e.g., a bit data 0, is written.

In the latter case, as described above, because the low resistance state is maintained irrespective of the existence of the applied voltage once the resistance of the first state data storage decreases, the bit data 0 stored in the data storage S is not lost regardless of whether is the applied voltage is interrupted.

The endurance of the to-be-tested data storage was tested. The endurance test consisted of making the to-be-tested data storage become the first state data storage, decreasing or increasing the resistance of the first state data storage, and measuring the current of the first state data storage. The endurance test was repeatedly performed many times.

Figure 3:
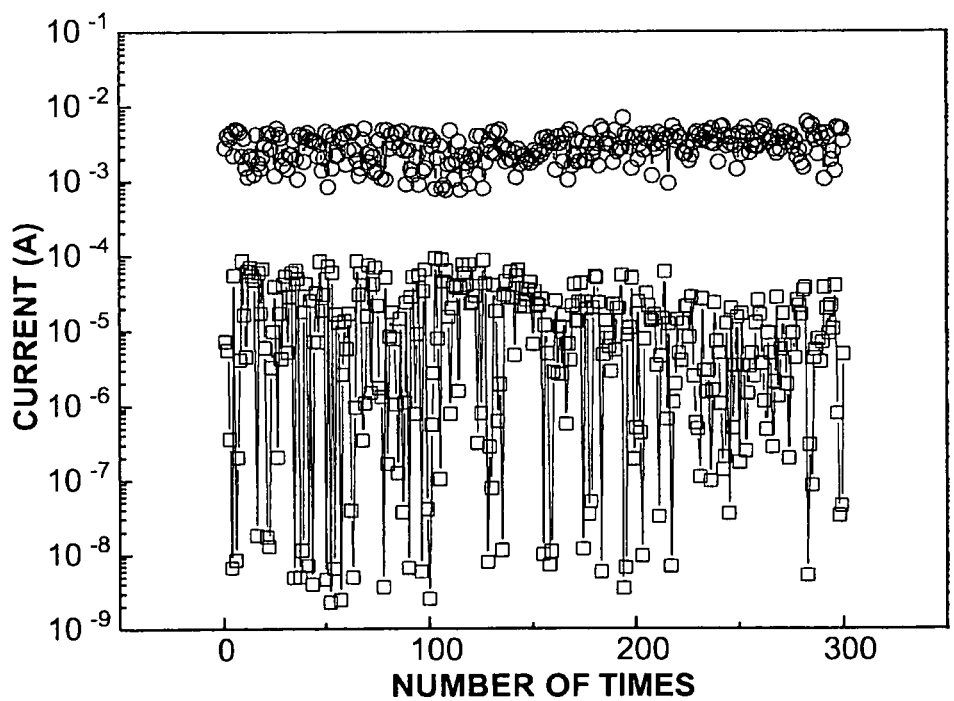
FIG. 3 is a graph of current versus a number of times an endurance test is performed illustrating results of the endurance test of the data storage of FIG. 1.

FIG. 3 is a graph of current versus a number of times the endurance test was performed illustrating results of the endurance test of the data storage of FIG. 1. Symbol □ in FIG. 3 represents a first current measured if the resistance of the first state data storage is low; symbol ○ in FIG. 3 represents a second current measured if the resistance of the first state data storage is high.

Referring to FIG. 3, while the first current and the second current vary whenever they are measured, it may be seen that the second current is more than ten times greater than the first current.

These results indicate that the endurance of the data storage according to example embodiments is excellent. Because the second current is more than ten times greater than the first current, as seen throughout the endurance test results, whether the measured current of the to-be-tested data storage is the first current or the second current is clearly identifiable. Accordingly, data stored in the data storage according to example embodiments may be read correctly even after passage of a significant length of time.

Figure 4:
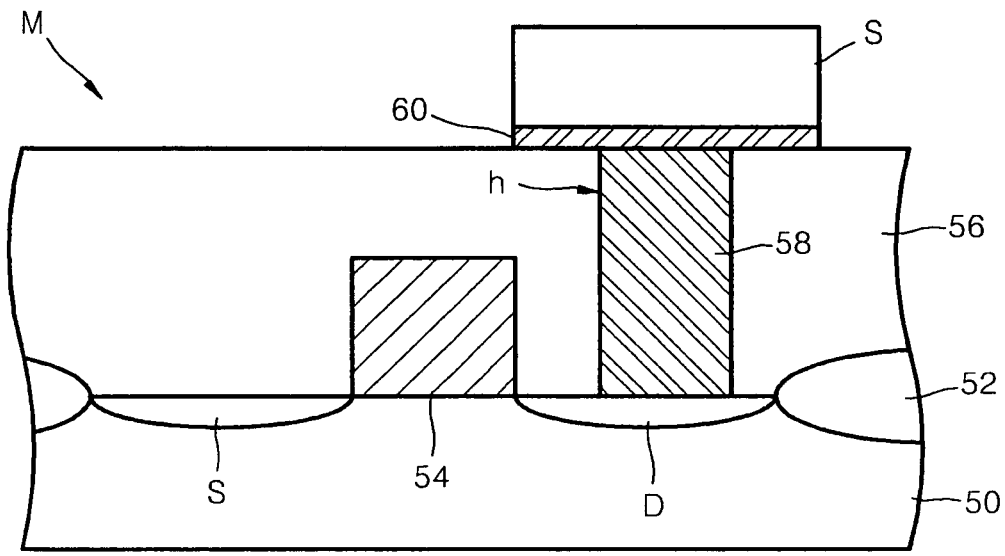
FIG. 4 illustrates a cross-sectional view of a semiconductor memory device according to example embodiments, the semiconductor memory device including the data storage of FIG. 1.

FIG. 4 illustrates a cross-sectional view of a semiconductor memory device according to example embodiments, the semiconductor memory device including the data storage of FIG. 1.

A semiconductor memory device M including the data storage S of FIG. 1 will now be explained with reference to FIG. 4.

Referring to FIG. 4, field oxide layers 52 are formed on set (or desired) areas of a substrate 50. A transistor, e.g., a gate 54, is formed on the substrate 50 between the field oxide layers 52. A source region S and a drain region D are formed on the substrate 50 between the gate 54 and one of the field oxide layers 52 and between the gate 54 and another one of the field oxide layers 52, respectively. The source region S and the drain region D may be formed through implantation of conductive impurities. An interlayer insulating layer 56, e.g., a boron-phosphorous-silicate glass (BPSG) layer, is formed on the substrate 50 to cover the field oxide layers 52 and the transistor. A contact hole h is formed through the interlayer insulating layer 56 to expose the drain region D. The contact hole h is then filled with a conductive plug 58. A diffusion barrier 60 may be formed on the interlayer insulating layer 56 to cover the conductive plug 58. The data storage S is then formed on the diffusion barrier 60. The data storage S preferably includes the lower electrode 40, the dielectric layer 42, and the upper electrode 44 as described in connection with FIG. 1.

If a particular lower electrode 40 and dielectric layer 42 are selected or if the lower electrode 40 itself is able prevent carriers from being diffused into the conductive plug 58 from the data storage S, the diffusion barrier 60 may be omitted.

It is preferable that a surface area of the data storage S is large. Accordingly, the data storage may not be a simple stacked data storage, but may be a more complex three-dimensional data storage, such as a cylinder-type stacked data storage.

A method of manufacturing the above-described semiconductor memory device M may include conventionally forming the transistor on the substrate 50, forming the interlayer insulating layer 56 on the substrate 50 to cover the transistor, forming the contact hole h through the interlayer insulating layer 56 to expose the drain region D of the transistor, filling the contact hole h with the conductive plug 58, and forming the data storage S on the interlayer insulating layer 56 to contact the conductive plug 58. The diffusion barrier 60 may be formed between the conductive plug 58 and the data storage S.

As shown in FIG. 1, the data storage S may be formed by forming the lower electrode 40, stacking the dielectric layer 42, which includes the first insulating layer 42a, the phase-transition layer 42b, and the second insulating layer 42c, on the lower electrode 40, and stacking the upper electrode 44 on the dielectric layer 42. The first insulating layer 42a may be a dielectric layer, e.g., a silicon oxide layer, a tantalum oxide layer, or an aluminum oxide layer, having a first thickness. The second insulating layer 42c may be a dielectric layer, e.g., a silicon oxide layer, a tantalum layer, or an aluminum layer, having a second thickness. The phase-transition layer 42b may be a dielectric layer having a third thickness that is capable of exhibiting different resistance characteristics according to a range of applied voltages depending on whether the insulating property thereof has been destroyed, e.g., by electrons being injected thereinto. For example, the phase-transition layer 42b may be an oxide layer of Group 5 atoms. A niobium layer is preferably used as the oxide layer of Group 5 atoms, but another oxide layer may alternatively be used. The first, second, and third thicknesses can be the same, but it is preferable that a ratio of the first, second, and third thicknesses is 5:6:5. For example, if both the lower electrode 42 and the upper electrode 44 have a thickness of 50 Å, the phase-transition layer 42b may have a thickness of 60 Å.

The electrons used to cause a phase transition of the phase-transition layer 42b, that is, used to cause the phase-transition layer 42b to display different resistance characteristics in different voltage ranges, may be injected to the phase-transition layer 42b by applying a set (or desired) voltage to the data storage S. The set voltage applied to the data storage S is a voltage at which the insulating property of the phase-transition layer 42b is changed or destroyed. In this process, it is preferable that a voltage across the phase-transition layer 42b is equal to or greater than a voltage across the first and second insulating layers 42 and 44. Accordingly, it is preferable that the phase-transition layer 42b has a dielectric constant less than the dielectric constants of the dielectric layers used as the first and second insulating layers 42 and 44.

Alternatively, the electrons used to destroy the insulating property of the phase-transition layer 42b can be injected into the phase-transition layer 42b by externally applying electrons having an energy that is high enough to pass through the upper electrode 44 and reach the phase-transition layer 42b to the data storage S, instead of applying the set voltage to the data storage S. Alternatively, if the phase-transition layer 42b is a niobium oxide layer, the insulating property of the phase-transition layer 42b can also be destroyed by applying light to the data storage S. The light, e.g., ultraviolet light, should have an energy that is high enough to separate some components, i.e., at least oxygen, of the phase-transition layer. The first and second insulating layers 42a and 42c prevent the separated oxygen from being discharged out of the phase-transition layer 42b.

A method of operating the semiconductor memory device M shown in FIG. 4 will now be explained.

<Write>

First, a voltage capable of destroying the insulating property of the dielectric layer of the data storage S is applied to the data storage S to destroy the insulating property of the dielectric layer. As the insulating property of the dielectric layer is destroyed, the data storage S becomes the first state data storage having the resistance characteristics as described above with reference to FIG. 2.

If the first voltage is applied to the first state data storage, the resistance of the first state data storage is lowered. If the second voltage is applied to the first state data storage, the resistance of the first state data storage is increased.

Hence, after the insulating property of the dielectric layer is destroyed and the transistor is turned on, the bit data 1 can be written by applying the first voltage to the first state data storage, or the bit data 0 can be written by applying the second voltage to the first state data storage. Alternatively, the written bit data values may be reversed.

<Read>

If an arbitrary bit data is written to the semiconductor memory device M of FIG. 4, the resistance of the phase-transition layer 42 varies according to the written bit data. Accordingly, the transistor is turned on, and the current of the data storage is measured by applying a set (or desired) read voltage to the data storage. If the measured current value is greater than a reference value, it is determined that the bit data 1 is read from the semiconductor memory device M. If the measured current value is less than the reference value, it is determined that the bit data 0 is read from the semiconductor memory device M. As noted above, the bit data according to the measured current values may be reversed, i.e., bit data 1 may be bit data 0, and bit data 0 may be bit data 1.

As described above, the dielectric layer of the data storage according to example embodiments includes the phase-transition layer capable of exhibiting two phases such that the phase-transition layer displays different resistance characteristics according to the range of applied voltages and maintains the characteristics irrespective of the existence of the applied voltage after the insulating property thereof is changed or destroyed, e.g., by injected electrons. A data storage according to example embodiments may be easily manufactured using a conventional semiconductor manufacturing process, and, thus, an additional process is not needed. Consequently, if the data storage according to example embodiments is applied to a general nonvolatile semiconductor memory device, such as a DRAM, the semiconductor memory device can maintain its original operation speed and advantageously possess nonvolatile characteristics. That is, the semiconductor memory device including the data storage according to example embodiments may have advantages of both DRAM and flash memory.

Example embodiments have been disclosed herein and, although specific terms are employed, they are used and are to be interpreted in a generic and descriptive sense only and not for purpose of limitation. For example, the transistor may be a thin film transistor, and some of the layers constituting the dielectric layer 42 may be ferroelectric layers. Moreover, a semiconductor memory device other than the semiconductor memory device shown in FIG. 4 may include the data storage shown in FIG. 1.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A data storage of a semiconductor device, the data storage comprising:
    a lower electrode;
    a first discharge prevention layer stacked on the lower electrode;
    a phase-transition layer on the first discharge prevention layer, the phase-transition layer including oxygen and exhibiting a different resistance characteristic when an insulating property thereof is changed;
    a second discharge prevention layer stacked on the phase-transition layer; and
    an upper electrode stacked on the second discharge layer, wherein the first and second discharge prevention layers are metal oxide layers including a tantalum oxide layer or an aluminum oxide layer configured for blocking discharge of the oxygen from the phase-transition layer.

2. The data storage as claimed in claim 1, wherein the first and the second discharge prevention layers have a dielectric constant smaller than a dielectric constant of the phase transition layer.

3. The data storage as claimed in claim 1, wherein a thickness ratio of the first discharge prevention layer, the phase-transition layer and the second discharge prevention layer is 5:6:5.

4. The data storage as claimed in claim 1, wherein the insulating property of the phase-transition layer is changed by injecting electrons into the phase-transition layer.

5. The data storage as claimed in claim 4, wherein the phase-transition layer is a niobium oxide layer.

6. The data storage as claimed in claim 1, wherein the insulating property of the phase-transition layer is changed by applying light to the data storage.

7. The data storage as claimed in claim 1, wherein the data storage is a cylinder-type stacked data storage.

8. A semiconductor memory device, comprising:
    a transistor; and
    the data storage according to claim 1.

9. The semiconductor memory device as claimed in claim 8, wherein the first and the second discharge prevention layer have a dielectric constant smaller than a dielectric constant of the phase-transition layer.

10. The semiconductor memory device as claimed in claim 8, wherein the insulating property of the phase-transition layer is changed by injecting electrons into the phase-transition layer.

11. The semiconductor memory device as claimed in claim 8, wherein a thickness ratio of the first discharge prevention layer, the phase-transition layer and the second discharge prevention layer is 5:6:5.

12. The semiconductor memory device as claimed in claim 8, wherein the phase-transition layer is a niobium oxide layer.

13. The semiconductor memory device as claimed in claim 8, wherein the insulating property of the phase-transition layer is changed by injecting electrons to the data storage.

14. The semiconductor memory device as claimed in claim 8, wherein the data storage is a cylinder-type stacked data storage.

* * * * *